United States Patent [19]

Hsu et al.

[11] Patent Number: 5,130,990
[45] Date of Patent: Jul. 14, 1992

[54] VLSI ARCHITECTURE FOR A REED-SOLOMON DECODER

[75] Inventors: In-Shek Hsu, Taipei, Taiwan; Trieu-Kie Truong, Pasadena, Calif.

[73] Assignee: The United States of America, as represented by the Administrator, National Aeronautics and Space Administration, Washington, D.C.

[21] Appl. No.: 480,449

[22] Filed: Feb. 15, 1990

[51] Int. Cl.⁵ .............................................. G06F 11/10
[52] U.S. Cl. .................................................. 371/37.1
[58] Field of Search ..................... 371/37.4, 37.6, 37.1, 371/38.1, 39.1, 43, 44, 45, 41

[56] References Cited

U.S. PATENT DOCUMENTS

| | | | |
|---|---|---|---|
| 4,653,052 | 3/1987 | Doi | 371/37.4 |
| 4,835,775 | 5/1989 | Seroussi | 371/37.1 |
| 4,907,233 | 3/1990 | Deutsch | 371/37.4 |

OTHER PUBLICATIONS

G. Maki, et al., "VLSI Reed-Solomon Decoder Design," Proceedings of the Military Communications Conference (Milcom), Monterey, Calif., pp. 46.5.1–46.5.6, Oct. 5–9, 1986.

I. S. Hsu, et al., "A Comparison of VLSI Architecture for Time and Transform Domain Decoding of Reed–Solomon Codes," TDA Progress Report, 42–92, vol. Oct.–Dec. 1987, Jet Propulsion Laboratory, Pasadena, Calif., pp. 63–81, Feb. 15, 1988.

I. S. Hsu, et al., "A Comparison of VLSI architectures of Finite Field Multipliers Using, Dual, Normal or Standard Basis," IEEE Trans. on Computers, vol. 37, 1988.

P. A. Scott, et al., "A Fast Multiplier for GS($2^m$)," IEEE Journal on Selected Areas in Communications, vol. SAC-4, No. 1, Jan. 1986.

I. S. Hsu et al., "A New VLSI Architecture for a Single-Chip Type Reed–Solomon Decoder" TDA Progress Report 42–96, Oct.–Dec. 1988.

*Primary Examiner*—Robert W. Beausoliel
*Attorney, Agent, or Firm*—Thomas H. Jones; John R. Manning; Guy M. Miller

[57] ABSTRACT

A basic single-chip building block for a RS decoder system is partitioned into a plurality of sections the first of which consists of a plurality of syndrome subcells each of which contains identical standard-basis finite-field multipliers that are programmable between 10-bit and 8-bit operation. A desired number of basic building blocks may be assembled to provide a RS decoder of any syndrome subcell size that is programmable between 10-bit and 8-bit operation.

5 Claims, 6 Drawing Sheets

VLSI ARCHITECTURE FOR A REED-SOLOMON DECODER

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

This invention relates to a very large scale integration (VLSI) architecture for implementing Reed-Solomon decoders by replicating a single VLSI chip. Furthermore, this Reed-Solomon decoder capable of correcting both errors and erasures is programmable for operation at different symbol sizes between 8-bit and 10-bit.

BACKGROUND ART

A (255,223) 8-bit Reed-Solomon (RS) code in concatenation with a (7, ½) Viterbi-decoded convolutional code has been recommended by the CCSDS (Consultative Committee for Space Data System) as a standard coding system for down link DSN (Deep Space Network) telemetry system. FIG. 1 shows a CCSDS recommended DSN transmission system. This concatenated coding system provides a coding gain of about 2 dB over the (7, ½) Viterbi-decoded only system.

Software simulations show that a (1023, 959) code, when concatenated with a (15, 1/6) Viterbi-decoded convolutional code, provides another 2 dB coding gain over the standard system recommended by CCSDS. This additional coding gain may be needed for future deep space missions to save cost since coding is among the most cost efficient way to improve system performance. A VLSI-based (15, 1/6) Viterbi decoder is currently being developed at the Jet Propulsion Laboratory to support the Galileo project and is expected to operate by 1991. Therefore, a (1023, 959) RS decoder is needed to provide the remainder of the 2 dB coding gain.

Recently, several VLSI architectures for implementing RS decoders have been proposed. However, the complexity of a RS decoder increases with the symbol size of the code. It is very unlikely that a RS decoder which can correct both errors and erasures will be implemented on a single chip in today's technology if the symbol size of the code is larger than 8 bits.

The existing VLSI RS decoders use a natural scheme to partition the decoder system. In this natural partitioning scheme, as many functional blocks in a RS decoder system are grouped together as possible and realized on the same VLSI chip. For instance, the VLSI chip set developed by the University of Idaho has four different types of VLSI chips. (G. K. Maki, et al., "VLSI Reed-Solomon Decoder Design," Proceedings of the Military Communications Conference (Milcom), Monterey, Calif., pp. 46.5.1-46.5.6, Oct. 5-9, 1986.) The first chip computes the syndromes. The second chip is the Euclid miltiply/divide unit. The third chip performs as a polynomial solver. The final chip is the error correction chip. This kind of partitioning scheme is straightforward. However, it is expected that several different types of VLSI chips are required to implement a RS decoder of symbol size larger than 8 bits.

The costs to design, fabricate and test VLSI-based systems increase drastically with the number of different chip types used. As an example, the (255, 223) error-correcting only RS decoder developed by the University of Idaho consists of four different types of VLSI chips, as just noted above. Assuming it takes 8 work-months to design and test a VLSI chip, which is a reasonable assumption for a VLSI chip of this complexity, four different chips require 32 work-months to develop. Furthermore, assuming it costs $80,000 to fabricate a VLSI chip of this complexity, the total VLSI chip fabrication cost of the above RS chips is $320,000. By utilizing the concept of the present invention, it takes only 8 work-months to design and test and $80,000 fabrication cost to develop VLSI chips for the single chip to be replicated for an RS decoder system. Based on the above analysis, a single-chip type RS decoder system is expected to have a five fold cost savings compared to RS decoder systems using conventional partition schemes.

As noted hereinbefore, the (255, 223) 8-bit RS code has been recommended by the CCSDS as part of the standard coding scheme in the DSN telecommunication system. Software simulations also show the system performance improvement obtained by concatenating a (1023, 959) 10-bit RS decoder with a (15, 1/6) Viterbi decoded convolutional code. Therefore, there is a need for developing both 8-bit and 10-bit RS decoders for current and future uses. As a consequence, it is desirable to realize an RS decoder which is capable of being switched between 8-bit and 10-bit codes. The key in developing such an 8-bit and 10-bit switchable RS decoder is the development of an 8-bit and 10-bit switchable finite field multiplier which is the most frequently used functional building block in an RS decoder.

STATEMENT OF THE INVENTION

An object of this invention is to provide a standard-basis finite-field multiplier for a RS decoder system which is switchable between a first and a second symbol size. A further object is to provide an architecture for implementing a time-domain RS decoder that can correct both errors, and erasures with a symbol size larger than the first symbol size by replication of a single VLSI chip using a programmable 8-bit/10-bit standard-basis finite-field multiplier for syndrome computation.

In accordance with the present invention, a standard-basis finite-field multiplier is provided for a Reed-Solomon decoder that can correct both errors and erasures with a symbol size of $n+1$ bits, where $n+1$ is larger than 8. The multiplier is comprised of n cells, each cell consisting of: three 1-bit registers $f_i$, $c_i$ and $a_i$, where $i=0,1,2 \ldots n+1$; two AND gates $G_1$ and $G_2$; and two exclusive OR gates $X_1$ and $X_2$, except the first cell which has only one exclusive OR gate $X_1$. The 1-bit register $a_i$ receives a multiplicand bit represented in the basis of $\{a^n \ldots a^3, a^2, a^1, 1\}$. It is multiplied by an input multiplier B in serial form $b_n \ldots b_3, b_2, b_1, b_0$, through AND gate $G_1$ and fed to the next cell $i+1$ through the exclusive OR gate $X_1$ of cell $i$ and the exclusive OR gate $X_2$ of cell $i+1$, except the last cell which feeds back through its exclusive OR gate $X_1$ directly to all cells through their AND gates $G_2$ for multiplication with an irreducible primitive polynomial $f(X)$ of the field. The output of AND gate $G_2$ of each cell except the first cell where $i=0$, is combined with the output of the exclusive OR gate $X_1$ of the preceding cell in the second exclusive OR gate $X_2$ to provide a multiplication bit output stored in the register $c_i$. The output of the AND gate $G_2$ of the first cell where $i=0$ is stored directly in the register $c_0$. The output of each register $c_i$ of a cell is connected to one of two inputs of the first exclusive OR gate $X_1$ of each cell. The other input to the exclusive OR gate $X_1$ is from the gate $G_1$ of the cell. The outputs of the $c_i$ registers provide a parallel output product $c_n \ldots, C_2, C_1, C_0$.

This standard-basis finite-field multiplier may be made programmable between (n+1)-bit and m+1-bit symbol sizes, where m is an integer less than n, such as $m=7$ and $n=9$, by providing a first electronic feedback switch connected between the output of the exclusive OR gate $X_1$ of the m-th cell to the input of the AND gate $G_1$ of each of the cells m, ... 2,1,0 under control of a binary program signal $\overline{ET}$ which commands an (m+1)-bit finite-field multiplier. A second electronic feedback switch similarly connected between the output of the exclusive OR gate $X_1$ of the n-th cell and an input of the AND gate $G_1$ of each of the cells m, ... 2,1,0. The second switch is held cut off by the binary program signal $\overline{ET}$. When that program signal is switched to its alternate binary level, the first feedback switch is turned off and the second feedback switch is turned on. In that manner, the standard-basis finite-field multiplier may, be programmably switched between (m+1)-bit and n+1-bit symbolisize operation.

A basic single-chip building block for a RS decoder system is partitioned into a plurality of sections the first of which consists of a plurality of syndrome subcells each of which contains identical standard-basis finite-field multipliers that are programmable between m-bit and n-bit operation. A desired number of basic building blocks may be assembled to provide a RS decoder of any syndrome subcell size that is programmable between m-bit and n-bit operation.

DETAILED DESCRIPTION OF THE INVENTION

A Reed Solomon (RS) code is a subset of the Bose-Chaudhuri-Hocquenghem (BCH) code. Therefore, a decoding technique for BCH codes can also be used to decode a RS code. Many schemes have been developed for decoding RS codes. However, among these schemes, the so-called "time domain" and "transform domain" decoding approaches are most frequently used. (For a comparison of the time domain decoder with the transform domain decoder see I. S. Hsu, T. K. Truong, I. S. Reed, L. J. Deutsch and E. H. Satorius, "A Comparison of VLSI Architecture for Time and Transform Domain Decoding of Reed-Solomon Codes," TDA Progress Report 42-92, vol. October-December 1987, Jet Propulsion Laboratory, Pasadena, Ca., pp. 63-81, Feb. 15, 1988.)

A pipeline transform domain RS decoder is suitable for small symbol sizes, such as 8-bit or less, while the time domain technique is suitable for realizing a RS decoder for the large codes, such as 10-bit or more. Mainly because of the need for the capability of switching from 8-bit to 10-bit decoding, the time domain approach is chosen for the present invention. A time domain decoding algorithm is comprised of the following steps:

(1) Compute syndromes and calculate the erasure locator polynomial.
(2) Compute the Forney syndromes.
(3) Determine the errata locator polynomial and the errata evaluator polynomial by applying the Euclidean algorithm.
(4) Compute the errata locations by "Chien Search" and compute the errata values.
(5) Perform the errata corrections.

Figure 1:
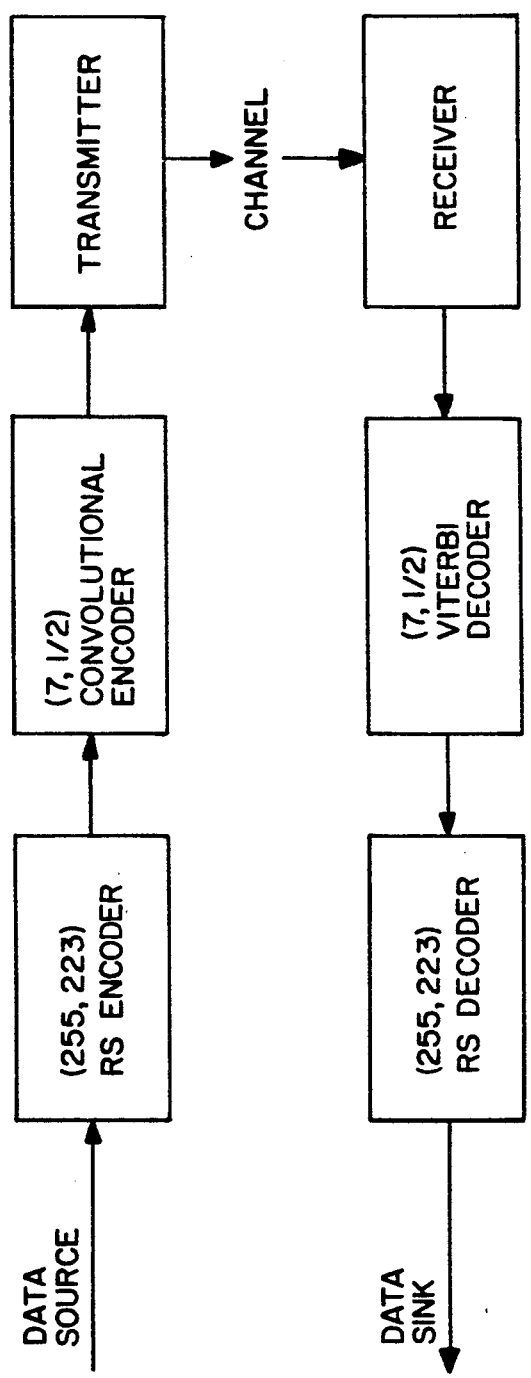
FIG. 1 illustrates a block diagram for a prior-art standard DSN telemetry coding system recommended by CCSDS.
Figure 2:
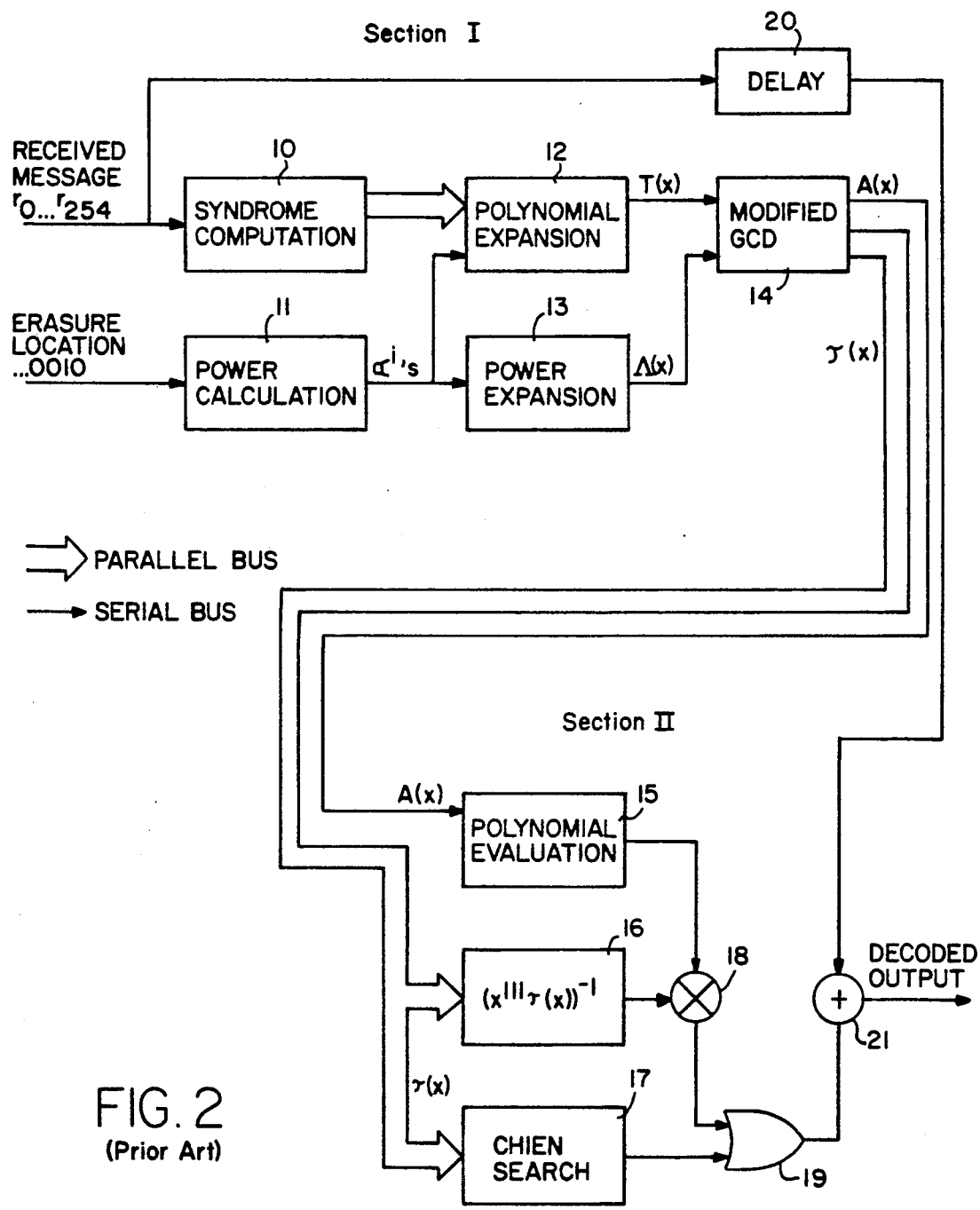
FIG. 2 illustrates a block diagram for a prior-art time domain RS decoder for errors and erasures.

FIG. 2, taken from the comparison paper by Hsu, et al., cited above, shows a block diagram of a time domain RS decoder to illustrate how this algorithm just outlined may be implemented in two parts I and II.

The first step of syndrome computation is carried out in block 10 and calculation of the erasure locator polynomial is carried out in blocks 11 through 14. Next the errata locator polynomial and the errata evaluator polynomial is determined in blocks 15 and 16 by applying the Euclidean algorithm. The errata locations are finally computed by the "Chien Search" in block 17 and the errata values are computed in a multiplier 18 and combined through an OR gate 19. The received message delayed in block 20 is then processed through an exclusive-OR gate 21 to provide a decoded output.

PROGRAMMABLE FINITE FIELD MULTIPLIER

The key element in an 8-bit and 10-bit switchable RS decoder is an 8-bit/10-bit programmable finite field multiplier in the syndrome computation block 10. This is due to the fact that finite field multipliers are the basic building blocks in implementing a RS decoder. A comparison of VLSI architectures of finite field multipliers using dual, normal or standard basis is discussed in I. S. Hsu, et al., "A Comparison of VLSI Architectures of Finite Field Multipliers Using, Dual, Normal or Standard Basis," IEEE Trans. on Computers, Vol. 37, 1988. Since any finite field element can be transformed into a standard basis representation irrespective of its original basis, the present invention focuses on the programmable design of a standard basis finite field multiplier.

Figure 3:
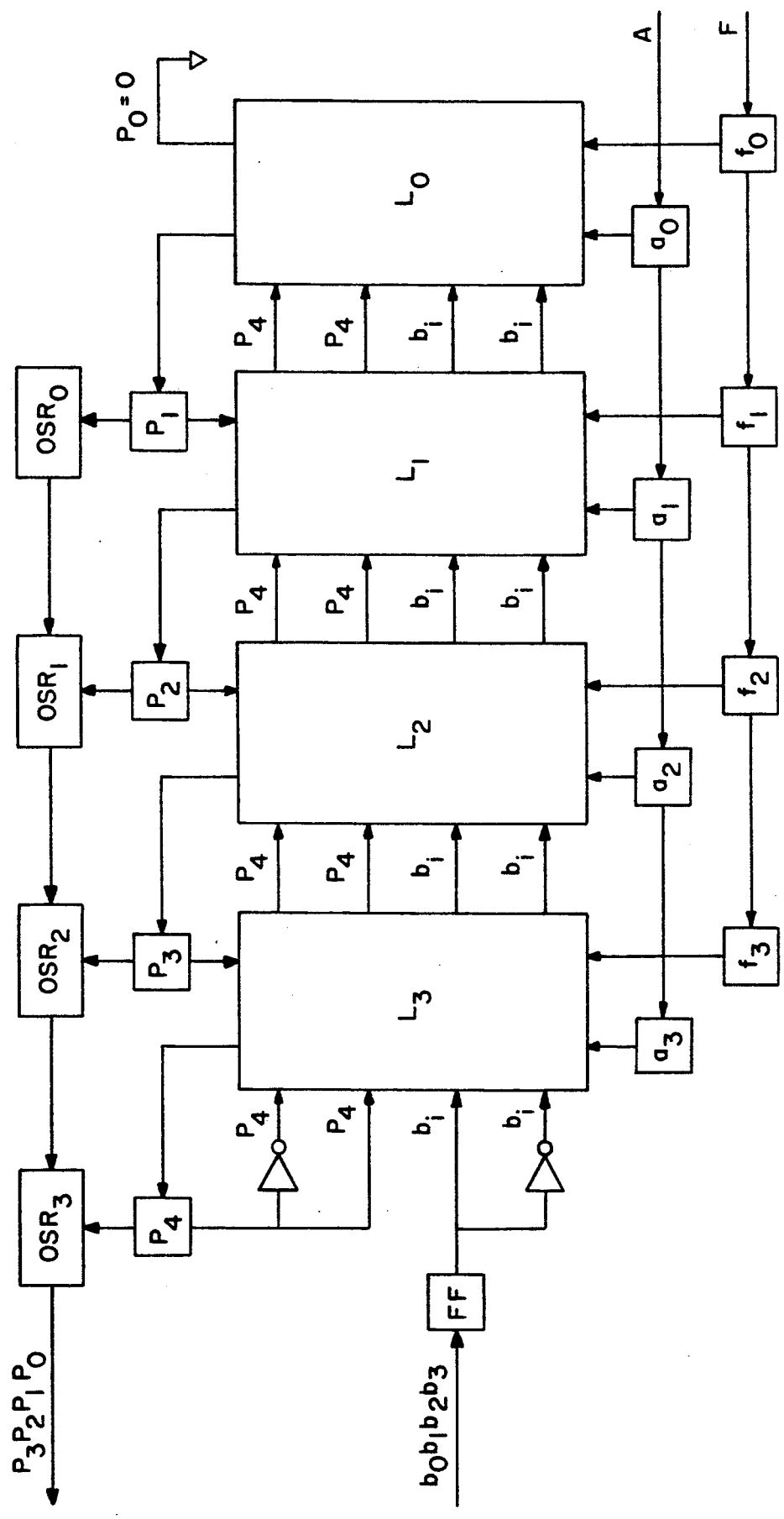
FIG. 3 illustrates a logic diagram of a prior-art standard-basis finite-field multiplier.

FIG. 3 illustrates a logic diagram of a finite field multiplier described by P. A. Scott, et al., "A Fast Multiplier for $GS(2^m)$," IEEE Journal on Selected Areas in Communications, Vol. SAC-4, No. 1, January 1986. Based on this architecture, a mathematical theory is first developed for this finite field multiplier architecture as follows.

Assuming the two inputs of this multiplier are $A = \alpha^i$ and $B = \alpha^j$, respectively, where $\alpha$ is the primitive element of $GF(2^m)$, then both A and B can be represented as:

$$A = \sum_{i=0}^{m-1} a_i \alpha^i, \text{ and} \quad (1)$$

$$B = \sum_{i=0}^{m-1} b_i \alpha^i \quad (2)$$

The product of A and B, i.e., $C = \alpha^k$, can also be represented as:

$$C = \sum_{i=0}^{m-1} c_i \alpha^i, \text{ and} \quad (3)$$

By the use of Horner's rule, the product C can be written as:

$$C = AB = A \sum_{k=0}^{m-1} b_k \alpha^k \quad (4a)$$

$$= (\ldots((Ab_{m-1}\alpha + Ab_{m-2})\alpha + Ab_{m-3})\alpha + \ldots Ab_1)\alpha + Ab_0 \quad (4b)$$

or
$$C^{(0)} = Ab_{m-1}, \quad (5)$$
$$C^{(1)} = Ab_{m-1}\alpha + Ab_{m-2} = C^{(0)}\alpha + Ab_{m-2}, \quad (6)$$
$$C^{(i)} = C^{(i-1)}\alpha + Ab_{m-1-i}, \quad (7)$$
$$C = C^{(m-1)} = C^{(m-2)}\alpha + Ab_0. \quad (8)$$

Figure 4:
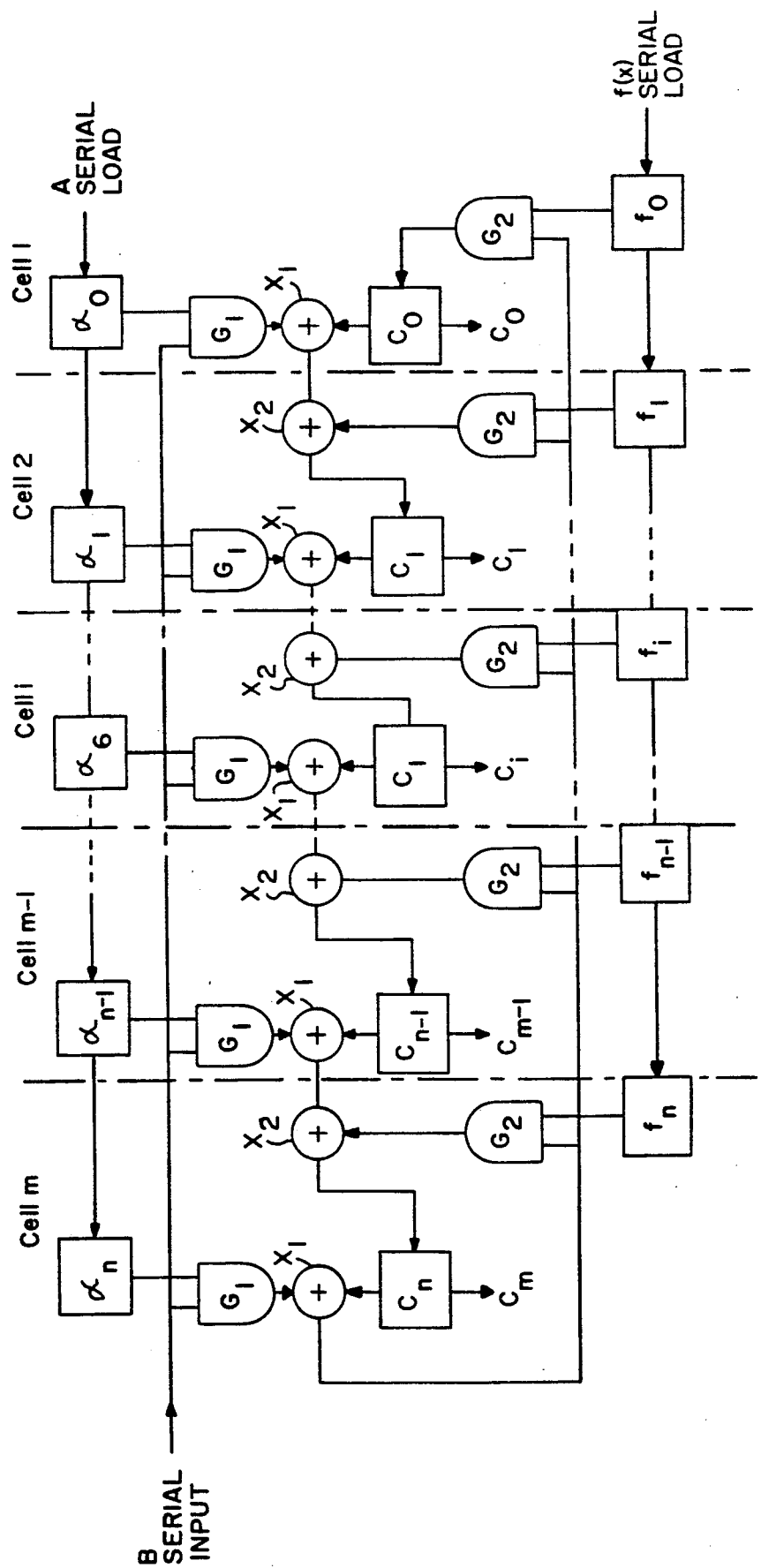
FIG. 4 illustrates a logic diagram of a 10-bit standard-basis finite field multiplier in accordance with the present invention.

FIG. 4 shows a logic diagram of a (m+1)-bit finite field multiplier consisting of n+1 identical cells 0-n with each cell containing three 1-bit registers $f_i$, $c_i$ and $\alpha_i$, where $i = 0, 1, 2 \ldots 7$, two AND gates $G_1$ and $G_2$ and two exclusive OR (XOR) gates $X_1$ and $X_2$, except the first cell which has only one XOR gate $X_1$.

There are three inputs to this multiplier. Inputs A and B represent the multiplicand and multiplier, respectively. They are represented in the basis of $\{\alpha^n, \alpha^{n-1} \ldots \alpha^i \ldots \alpha^1, 1\}$. Another input f(X) is the irreducible primary polynomial of the field. For a 10-bit finite field multiplier, let n=9, and $$f(X) = X^{10} + f_9 X^9 + f_8 X^8 + f_7 X^7 + f_6 X^6 + f_5 X^5 + f_4 X^4 + f_3 X^3 + f_2 X^2 + f_1 X^1 + f_0 X^0, \quad (9)$$

where $f_i \in GF(2)$. In real world applications, both A and f(X) can be loaded into a register $\alpha$ and a register f, respectively, in either parallel or serial form. The serial form is chosen in FIG. 4 for the purpose of illustration. However, the multiplier B must come in serially, bit by bit, with $b_9$ first and $b_0$ in last. Initially, the C-register is reset to zero. At the first clock time, $C^{(0)}$ as described by Equation (5) is obtained. At the second clock time, $C^{(1)}$ as described by Equation (6) is obtained, etc. After 10 clock cycles, the final product C as described by Equation (8) is obtained in the C-register. It can then be shifted out either in parallel or serial form, depending on the application. For purposes of illustration parallel read out of the final product is shown.

Figure 5:
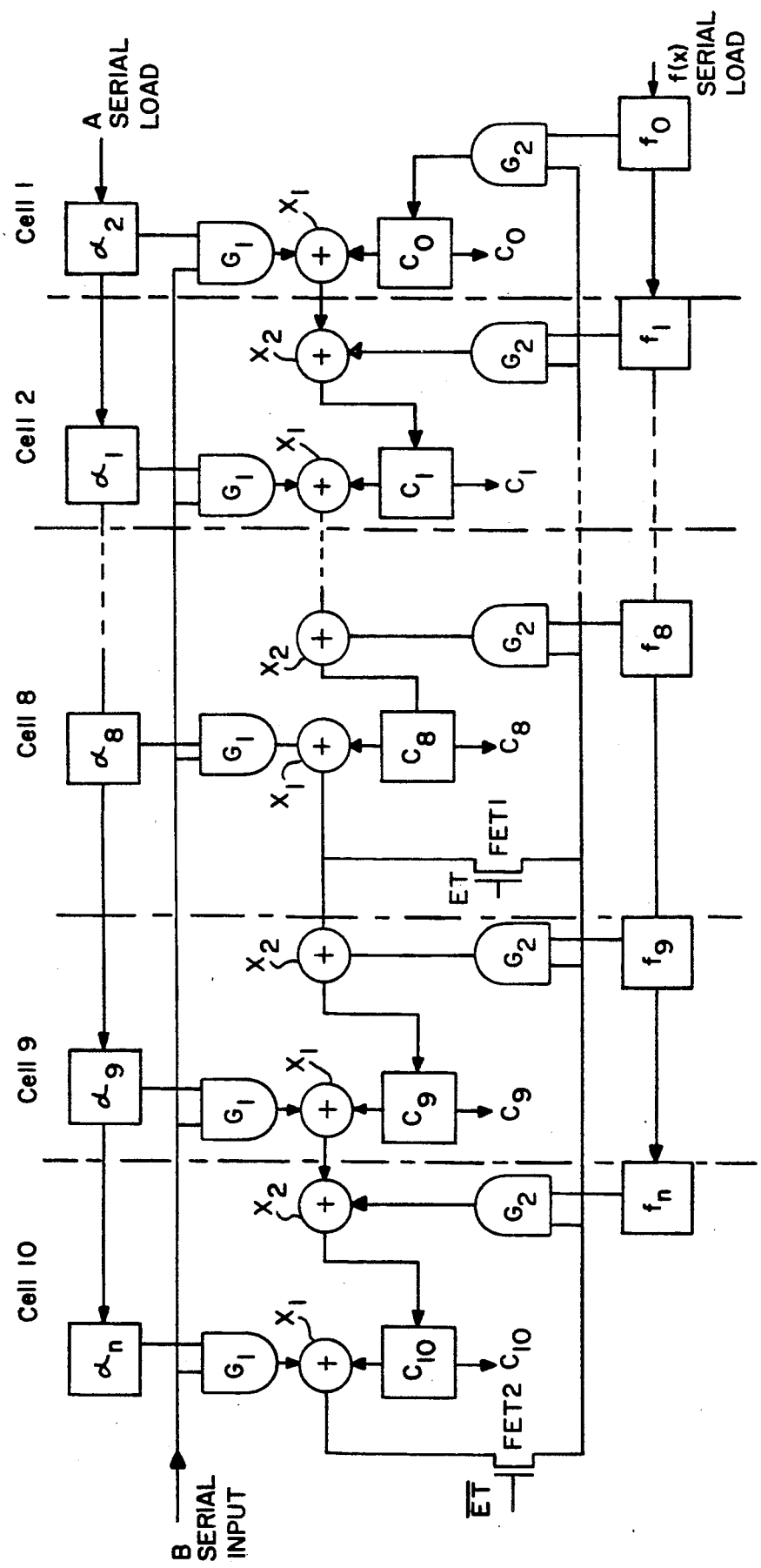
FIG. 5 illustrates a logic diagram of the finite field multiplier of FIG. 4 with two added field-effect transistors which may be controlled for programmable switching between an 8-bit and a 10-bit symbol size multiplier in an RS decoder.

A programmable 8-bit/10-bit finite field multiplier is obtained by modifying the architecture depicted in FIG. 4 when (n+1)=10 an electronic feedback switch, gate FET-1, at the input of the ninth cell from the output of exclusive-OR gate $X_1$ in the eight cell, and a feedback gate FET-2 in the output of the tenth cell, where the order of the ten cells is indicated by the subscripts 0 through 9 for the flip-flops $\alpha_i$, $f_i$ and $c_i$ of the registers shown in FIG. 5 for the multiplicand A, the irreducible primary polynomial of the field f(X), and the product C, respectively. Thus, FIG. 5 shows a programmable 8-bit/10-bit finite field multiplier. When a signal ET which commands 8-bit finite-field multiplication is low, the switch FET-1 is on and the FET switch FET-2 is off. Therefore, the feedback will be conducted at the output of the eighth cell. Of course, all of the three inputs to the finite field multiplier must be reformatted as to their representation, i.e., the highest two bits $\{a_9, a_8\}$, $\{b_9, b_8\}$, and $\{f_9, f_8\}$ are all set equal to zero when the signal ET commands 8-bit finite-field multiplication. When the signal ET is high, the feedback is from the last (tenth) cell and the highest two bits of the multiplicand A, multiplier B, and the polynomial f(X) are not set equal to zero. Setting $b_8$ and $b_9$ to zero for an 8-bit multiplication may be accomplished by an input gate FET-3 which received a timed control signal $\overline{ET}_{(8,9)}$ during the 8th and 9th bit time of the serial multiplier B when the control signal ET is low to open the input line for the multiplier B during the 8th and 9th bit times of a multiplication cycle, or it can be controlled at the source of the multiplier B.

VLSI ARCHITECTURE OF A SINGLE-CHIP TYPE RS DECODER CHIP

Figure 6:
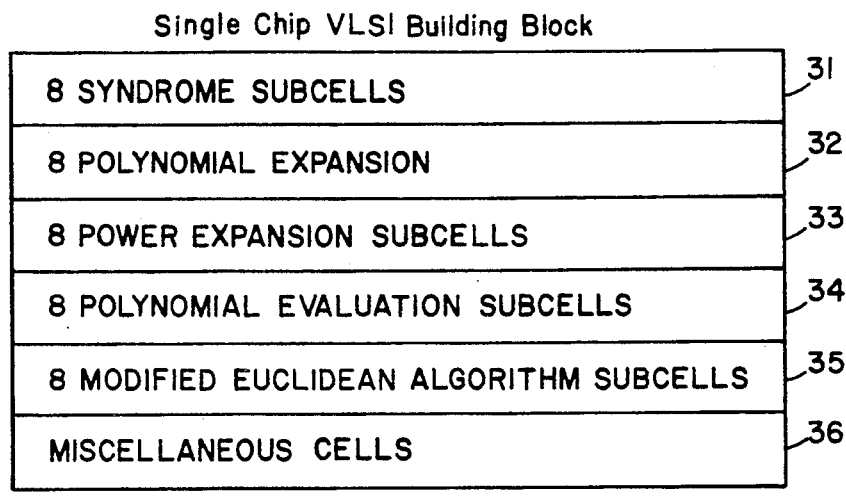
FIG. 6 is a block diagram of VLSI chip architecture in the single-chip type RS decoder system utilizing the switchable 8-bit/10-bit finite field multiplier of FIG. 5.

The development of this new architecture is based on the VLSI architecture of a RS decoder described in "A Comparison of VLSI Architectures for Time and Transform Domain Decoding of Reed-Solomon Codes," by I. S. Hsu, et al., cited above. Because of the regularity of a time-domain RS decoder structure, the functional units in a RS decoder can be partitioned in an efficient manner. FIG. 6 shows the organization of a VLSI chip which s a basic building block of the single-chip type RS decoder system. As shown, a VLSI chip is partitioned into six functional sections 31-36. The first section 31 of the chip consists of eight identical syndrome subcells. The programmability between 8-bit and 10-bit of an RS decoder is realized by making both the shift registers and the finite field multipliers in all the subcells programmable between 8-bit and 10-bit operation as discussed with reference to FIG. 5. In other words, each of the eight syndrome computation subcells is programmable by the signal ET for operation as either an 8-bit or 10-bit multiplier. The subcells of the remaining sections 32 through 36 are readily programmed for 8-bit or 10-bit operation by simply switching off the two most significant bit positions with the signal ET low.

The second section 32 in FIG. 6 has eight polynomial expansion subcells. The third section 33 consists of eight power expansion subcells. The fourth section 34 is composed of eight polynomial evaluation subcells which can also be used to do the "Chien Search" operation. The fifth section 35 has eight modified euclidean subcells. Finally, the sixth section 36 of the VLSI chip contains all miscellaneous cells such as counters, shift registers, finite-field multipliers, and so forth. These miscellaneous cells are used as "glue" logic in a VLSI RS decoder system.

Figure 7:
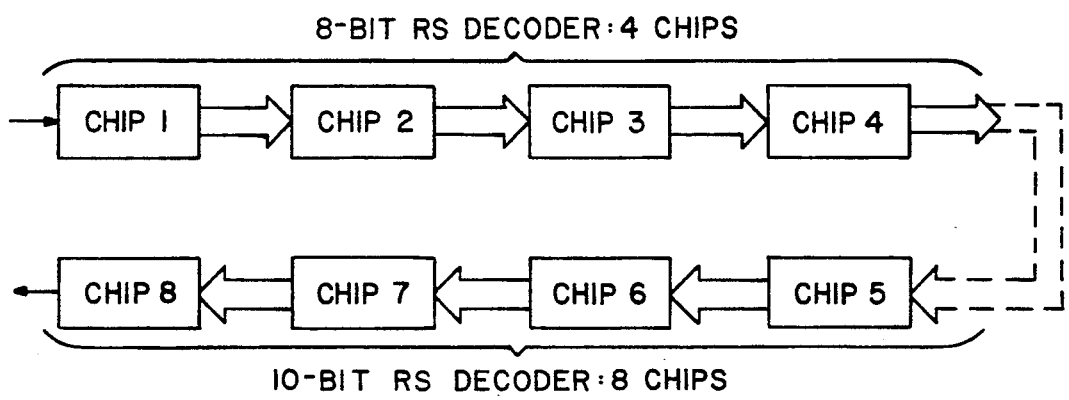
FIG. 7 is a block diagram of an 8-bit/10-bit RS decoder.

As shown in FIG. 7, if four of these VLSI chips shown in FIG. 6 are arrayed in tandem for operation as an 8-bit RS decoder, a (255, 223) time domain RS decoder is formed since there are enough subcells to implement all the functional units. In other words, there are 32 syndrome subcells, 32 power expansion subcells, 32 polynomial expansion subcells, 32 modified Euclidean subcells and 32 polynomial evaluation and Chien search subcells. Since all the subcells are programmable between 8-bit and 10-bit, the core of a 10-bit (1023, 959) RS decoder is formed by arraying in tandem eight copies of the VLSI chip shown in FIG. 6. All that is necessary is control of the level of the signal ET.

It is estimated the total number of pins required for a VLSI chip shown in FIG. 6 is less than 132 and the total number of transistors per chip is less than 60K. These requirements are well within the capability of today's VLSI technology.

The number of subcells in a VLSI chip could be reduced to half to decrease the silicon real estate and, therefore, to increase chip yield by providing only 4 subcells in each functional section implemented on a VLSI chip. The number of transistors is then reduced from 60K, but the number of chips is doubled. On the other hand, if good fabrication technology is available, the number of functional subcells in a chip could be doubled such that the chip count in an RS decoder system is reduced by half. Therefore, this RS decoder architecture provides the maximum flexibility in both the chip and system designs.

CONFIGURATION OF A SINGLE-CHIP TYPE RS DECODER SYSTEM

Figure 8:
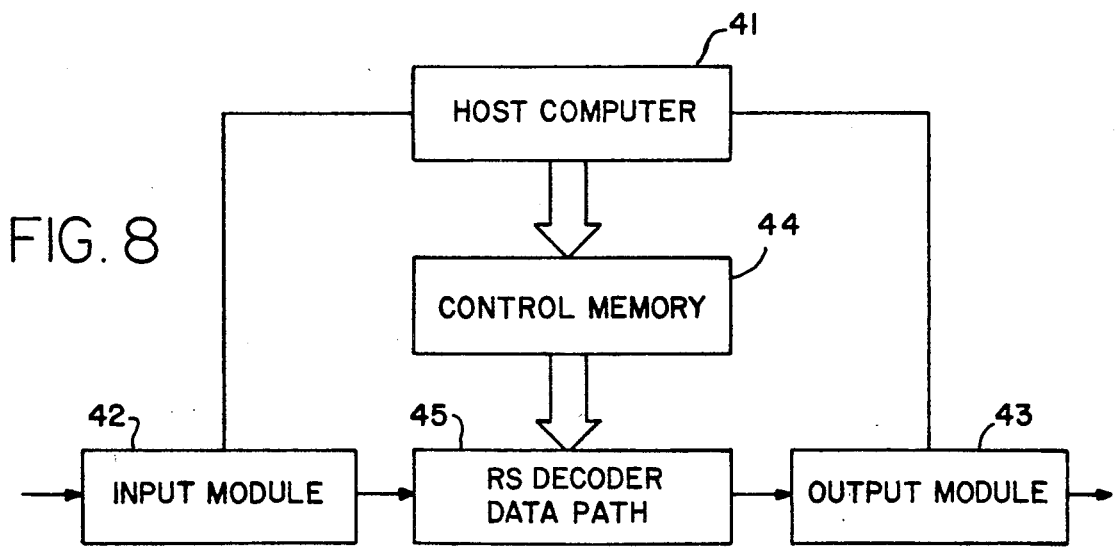
FIG. 8 is a system block diagram of an 8-bit/10-bit RS decoder of the present invention disclosed with reference to FIGS. 4, 5, 6 and 7.

The system configuration of the single-chip type RS decoder is shown in FIG. 8. The system is partitioned into 5 units 41 through 45. There is a host computer 41, which may be a personal computer, to issue commands to the whole system. An input module 42 which consists mostly of memory chips is used to store the received messages. Operations such as formating, basis conversion if both standard or dual basis are used, zero-fill . . . , etc. will be performed in this unit. Similarly, an output module 43 is used to store the decoded symbols and performing operations such as basis reconversion, reformating, zero-stripping.

A control memory unit 44 is used to store all the control signals for controlling the VLSI chips. Due to the large number of control signals needed to control VLSI chips, it is not effective to include the control signal generation in the VLSI chips but rather in a separate dedicated chip. Moreover, partitioning of the VLSI chips will become very difficult if the control signal generators are included. It is expected that the control memory unit 44 will consist of EPROM's which store control signals of the VLSI chips. Further modifications or expansions of control signals for the VLSI chip will be relatively easy by this scheme. Finally, the fifth part 45 of the RS decoder system is the RS decoder VLSI chip set disclosed with reference to FIGS. 5, 6 and 7. This is the core of an RS decoder system which is switchable between 8-bit and 10-bit symbol sizes implemented with a single chip replicated many times and arrayed in tandem.

Although particular embodiments of the invention have been described and illustrated herein, it is recognized that modifications and variations may readily occur to those skilled in the art. Consequently, it is intended that the claims be interpreted to cover such modifications and variations.

We claim:

1. A standard-basis finite-field multiplier for a Reed-Solomon decoder that can correct both errors and erasures with a symbol size of $n+1$ bits comprised of $n+1$ cells, each cell consisting of three 1-bit registers $f_i$, $c_i$ and $\alpha_i$, where $i=0,1,2 \ldots n$, two AND gates $G_1$ and $G_2$, and two exclusive OR gates $X_1$ and $X_2$, except the first cell which has only one exclusive OR gate $X_1$, said 1-bit register $\alpha_i$ being connected to receive a multiplicand bit represented in a basis of $\{\alpha^n \ldots \alpha^3, \alpha^2, \alpha^1, 1\}$ that is multiplied by an input multiplier B in serial form $b_n \ldots b_3, b_2, b_1, b_0$, through said AND gate $G_1$ and fed to the next cell $i+1$ through said exclusive OR gate $X_1$ of cell $i$ and said exclusive OR gate $X_2$ of cell $i+1$, except the last cell n which feeds back through said exclusive OR gate $X_1$ directly to all cells through said AND gates $G_2$ for multiplication with an irreducible primitive polynomial $f(X)$ of the field in said 1-bit register $f_i$, wherein the output of AND gate $G_2$ of each cell except the first cell, where $i=0$, is combined with the output of the exclusive OR gate $X_1$ of the preceding cell in the second exclusive OR gate $X_2$ to provide a multiplication bit output stored in the register $c_i$ and the output of the AND gate $G_2$ of the first cell, where $i=0$, is stored directly in the register $c_0$ and the output of each register $c_i$ of a cell is connected to one of two inputs of the first exclusive OR gate $X_1$ of each cell, the other input to the exclusive OR gate $X_1$ being from the gate $G_1$ of the cell, whereby the outputs of the $c_i$ registers provide a parallel output product $C_n \ldots, C_2, C_1, C_0$.

2. A standard-basis finite-field multiplier as defined in claim 1 programmable between $(n+1)$-bit and $(m+1)$-bit symbol sizes, where m is an integer less than n, by a first electronic feedback switch connected between the output of the exclusive OR gate $X_1$ of the last cell of cascaded cells m, . . . 2,1,0 to an input of said AND gate $G_1$ of each of the cells m, . . . 2,1,0 under control of a binary program signal $\overline{ET}$ which commands an $(m+1)$-bit finite-field multiplier, and a second electronic feedback switch similarly connected between the output of the exclusive OR gate $X_1$ of the last cell of cascaded cells n, . . . m, . . . $n_1,n_2,n_0$ and an input of said AND gate $G_1$ of each of said cells m, . . . 2,1,0, said second switch being held cut off by the binary program signal $\overline{ET}$, whereby upon switching said program signal to its alternate binary level, said first feedback switch is turned off and second feedback switch is turned on, thereby enabling said standard-basis finite-field multiplier to be programmably switched between $(m+1)$-bit and $(n+1)$-bit operation.

3. A standard-basis finite-field multiplier as defined in claim 2 wherein $m=7$ and $n=9$.

4. A basic single-chip building block for a RS decoder system partitioned into a plurality of sections the first of which consists of a plurality of syndrome subcells each of which contains identical standard-basis finite-field multipliers that are programmable between $(m+1)$-bit and $(n+1)$-bit symbol size operation, where m is an integer less than n, comprised of $n+1$ cells, each cell consisting of three 1-bit registers $f_i$, $c_i$ and $\alpha_i$, where $i=0, 1, 2. . .n$, two AND gates $G_1$ and $G_2$, and two exclusive OR gates $X_1$ and $X_2$, except the first cell which has only one exclusive OR gate $X_1$, said 1-bit register $\alpha_i$ being connected to receive a multiplicand bit represented in a basis of $\{\alpha^n \ldots \alpha^3, \alpha^2,\alpha^1,1\}$ that is multiplied by an input multiplier B in serial form $b_n \ldots b_3,b_2,b_1,b_0$, through said AND gate $G_1$ and fed to the next cell $i+1$ through said exclusive OR gate $X_1$ of cell i and said exclusive OR gate $X_2$ of cell $i+1$, except the last cell n which feeds back through said exclusive OR gate $X_1$ directly to all cells through said AND gates $G_2$ for multiplication with an irreducible primitive polynomial $f(X)$ of the field in said 1-bit register $f_i$, wherein the output of AND gate $G_2$ of each cell except the first cell, where $i=0$, is combined with the output of the exclusive OR gate $X_1$ of the preceding cell in the second exclusive OR gate $X_2$ to provide a multiplication bit output stored in the register $c_i$ and the output of the AND gate $G_2$ of the first cell, where $i=0$, is stored directly in the register $c_o$ and the output of each register $c_i$ of a cell is connected to one of two inputs of the first exclusive OR gate $X_1$ of each cell, the other input to the exclusive OR gate $X_1$ being from the gate $G_1$ of the cell, whereby the outputs of the $c_i$ registers provide a parallel output product $C_n \ldots, C_2, C_1, C_0$, wherein said syndrome subcells are each programmable between $(n+1)$-bit and $(m+1)$-bit symbol size by a first electronic feedback switch connected between the output of the exclusive OR gate $X_1$ of the last cell of cascaded cells m, . . . 2,1,0 to an input of said AND gate $G_1$ of each of the cells m, . . . 2,1,0 under control of a binary program signal $\overline{ET}$ which commands an $(m+1)$-bit finite-field multiplier, and a second electronic feedback switch similarly connected between the output of the exclusive OR gate $X_1$ of the last cell of cascaded cells n, . . . m, . . . $n_1, n_2, n_0$ and an input of said AND gate $G_1$ of each of said cells m, . . . 2,1,0, said second switch being held cut off by the binary program signal $\overline{ET}$, whereby upon switching said program signal to its alternate binary level, said first feedback switch is turned off and second feedback switch is turned on, thereby enabling said standard-basis finite-field multiplier to be programmably switched between $(m+1)$-bit and $(n+1)$-bit operation, whereby a desired number of identical basic building blocks may be assembled to provide a RS decoder of any syndrome subcell size that is programmable between $(m+1)$-bit and $(n+1)$-bit operation.

5. A standard basis finite-field multiplier as defined in claim 4 wherein $m=7$ and $n=9$.

* * * * *